(12) United States Patent
Goto et al.

(10) Patent No.: US 7,044,399 B2
(45) Date of Patent: May 16, 2006

(54) HEATING SYSTEMS

(75) Inventors: Yoshinobu Goto, Nagoya (JP); Hideyoshi Tsuruta, Tokai (JP)

(73) Assignee: NGK Insulators, Ltd., Nagoya (JP)

( * ) Notice: Subject to any disclaimer, the term of this patent is extended or adjusted under 35 U.S.C. 154(b) by 161 days.

(21) Appl. No.: 10/702,131

(22) Filed: Nov. 5, 2003

(65) Prior Publication Data
US 2004/0177812 A1    Sep. 16, 2004

(30) Foreign Application Priority Data
Nov. 18, 2002    (JP)    ............................. P2002-333950

(51) Int. Cl.
    *F24H 3/00*    (2006.01)
(52) U.S. Cl. .................. 237/76; 219/444.1; 219/443.1
(58) Field of Classification Search .................. 237/76, 237/2 A; 219/441, 443.1, 448.11; 165/130, 165/136
    See application file for complete search history.

(56) References Cited
U.S. PATENT DOCUMENTS

| | | | | |
|---|---|---|---|---|
| 6,072,162 A * | 6/2000 | Ito et al. .................. | 219/444.1 |
| 6,133,557 A * | 10/2000 | Kawanabe et al. ......... | 219/544 |
| 6,207,932 B1 * | 3/2001 | Yoo ......................... | 219/444.1 |
| 6,432,207 B1 * | 8/2002 | Fan .............................. | 118/724 |
| 6,448,538 B1 * | 9/2002 | Miyata .................... | 219/444.1 |
| 6,455,826 B1 * | 9/2002 | Araya et al. ................ | 219/699 |
| 6,469,283 B1 * | 10/2002 | Burkhart et al. ............ | 219/486 |
| 6,768,089 B1 * | 7/2004 | Minobe et al. ............. | 219/699 |
| 6,818,852 B1 * | 11/2004 | Ohmi et al. ........... | 219/121.43 |
| 6,875,960 B1 * | 4/2005 | Yamaguchi et al. ..... | 219/462.1 |

FOREIGN PATENT DOCUMENTS

| JP | 05-326112 A1 | 12/1993 |
|---|---|---|
| JP | 10-273370 A1 | 10/1998 |

* cited by examiner

*Primary Examiner*—Derek S. Boles
(74) *Attorney, Agent, or Firm*—Burr & Brown

(57) ABSTRACT

A heating system 1 has a ceramic substrate 2 having a mounting face 2a for mounting an object W, a back face 2b and a side face 2c; a heating means 3 for generating heat from the mounting face 2a of the ceramic substrate 2; and a plate-shaped supporting metal member 4 for supporting the back face 2b of the ceramic substrate 2. According to the system, the thermal deformation of the mounting face upon heating over time may be reduced and the flatness of the object may be maintained at a low value. It is further possible to impart a mechanical strength to the heater sufficient for its handling and to reduce the production cost.

12 Claims, 6 Drawing Sheets

(a)

(b)

(c)

HEATING SYSTEMS

This application claims the benefit of Japanese Patent Application P2002-333, 950 filed on Nov. 18, 2002, the entirety of which is incorporated by reference.

BACKGROUND OF THE INVENTION

1. Field of the Invention

The invention relates to a heating system.

2. Related Art Statement

In a system for producing semiconductors, a ceramic heater may be provided for heating a wafer so as to deposit a semiconductor thin film on the wafer from gaseous raw materials such as silane gas by means of thermal CVD or the like. A so called two-zone heater is known as such ceramic heater. Such two-zone heaters have a ceramic substrate and inner and outer resistance heat generators of a metal having a high melting point embedded within the substrate. Separate power supply terminals are connected to the respective heat generators so that electric power may be applied independently on the respective generators. The inner and outer heat generators may be thus independently controlled.

Further, in JP-A 5-326112, a resistance heat generator of a ceramic heater is constituted by plural circuit patterns, each made of a high melting point metal. The circuit patterns are so arranged that they may supplement one another's defect portions. For example, one of the patterns has a defect portion such as a folded portion or a returning portion. In this case, another circuit pattern is overlapped on or over the defect portion of the one pattern.

For example, in a heater used for heating semiconductor wafers, the temperature of the heating surface of the heater needs to be uniformly controlled over the entire surface. It is required that the heater satisfy a severe specification, for example, that the temperature measured on the heating surface is within ±10° C. on the whole heating surface under a use condition.

A ceramic heater is excellent on the viewpoint of uniformity of temperature on the heating face. Further, when a semiconductor wafer is mounted and heated, thermal deformation of the mounted face of the wafer over time may be prevented to preserve the flatness of the wafer at a low value.

SUMMARY OF THE INVENTION

However, a production cost for a ceramic heater is high. In particular, a ceramic heater is supported with a tubular supporting member, which is then fixed onto a chamber. A thicker substrate is needed for the heater for providing a strength required for supporting the heater, so that a production cost for the ceramic heater is increased.

On the other hand, a metal heater has a high mechanical strength and may be produced with a lower production cost. However, when a semiconductor wafer is mounted and heated thereon, the mounting face of the heater may be substantially deformed over time. The flatness of the wafer cannot be thus maintained.

An object of the present invention is to provide a novel heating system for mounting and heating an object, to reduce the thermal deformation of its mounting face over time upon heating, and thus to maintain the flatness of the object.

Another object of the present invention is to reduce the production cost of the heating system while preserving a mechanical strength required for supporting the system.

The present invention provides a heating system comprising:

a ceramic substrate having a mounting face for mounting an object, a back face and a side face;

a heating means for generating heat from the mounting face of the ceramic substrate; and a plate-shaped metal supporting member for supporting the back face of the ceramic substrate.

According to the heating system of the present invention, a mounting face for an object is provided in a ceramic substrate to generate heat from the mounting face to heat the object. It is thus possible to reduce the thermal deformation of the mounting face over time upon heating of the ceramic substrate. The flatness of the object may be thus maintained at a low value. Moreover, a plate-shaped and metal supporting member for supporting the back face of the ceramic substrate is provided, so that the production cost of the heating system may be reduced and a mechanical strength required for supporting the system may be assured.

These and other objects, features and advantages of the invention will be appreciated upon reading the following description of the invention when taken in conjunction with the attached drawings, with the understanding that some modifications, variations and changes of the same could be made by the skilled person in the art.

PREFERRED EMBODIMENTS OF THE INVENTION

The present invention will be described below further in detail.

Figure 1:
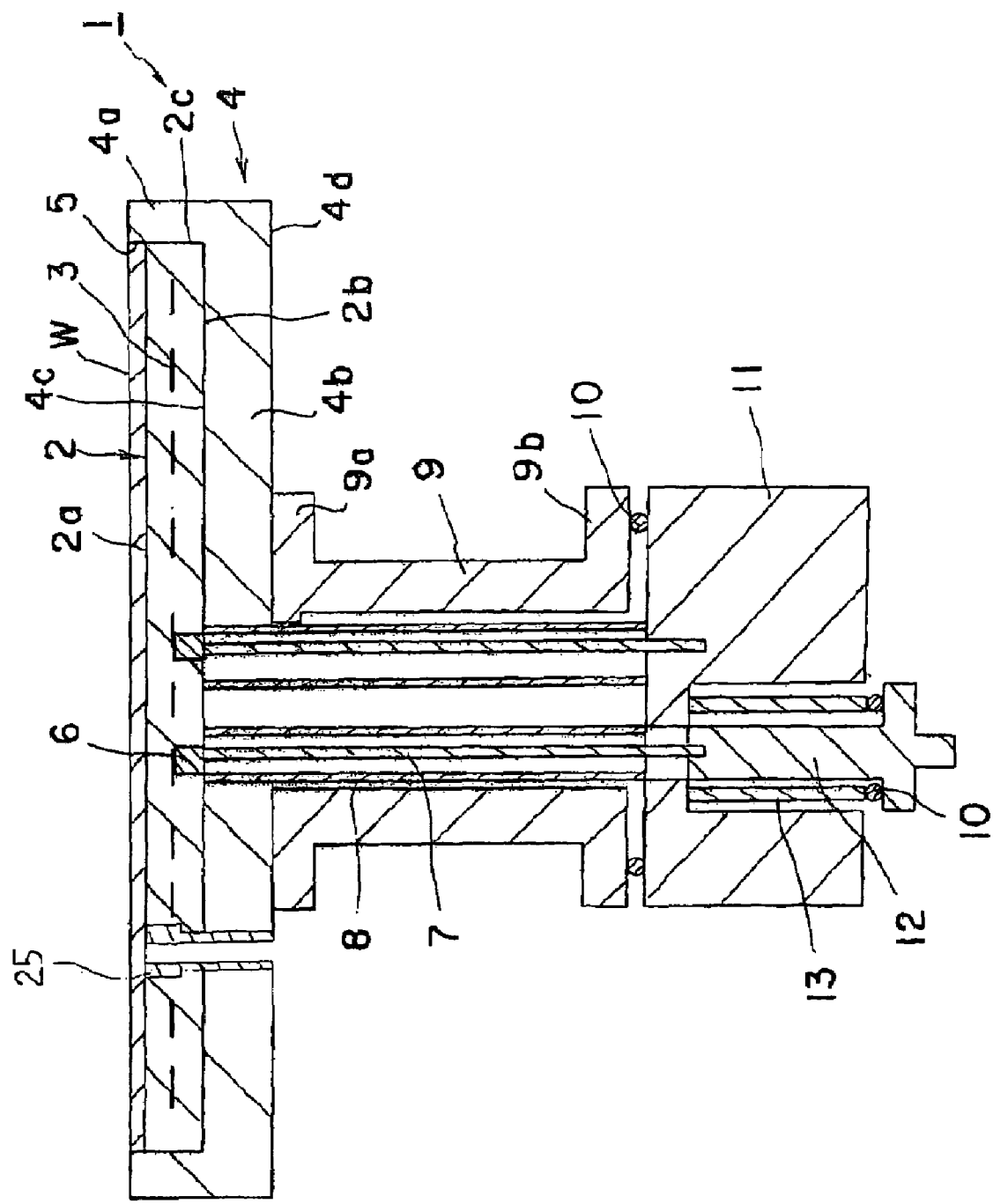
FIG. 1 is a cross sectional view schematically showing a healing system 1 according to one embodiment of the present invention.

In a preferred embodiment, the heating means is a heat resistor embedded in a ceramic substrate. FIG. 1 is a cross sectional view schematically showing a heating system 1 according to this embodiment. A metal and plate-shaped supporting member 4 has a flat-plate shaped portion 4b, and a flange portion 4a protruding from the peripheral part of the flat-plate shaped portion 4b. A ceramic substrate 2 is mounted on the surface 4c of the flat-plate shaped portion 4b. A heat resistor 3 is embedded in the ceramic substrate 2. A back face 2b of the ceramic substrate 2 is contacted with the surface 4c of the flat-plate shaped portion 4b to mount an object W on the mounting face 2a of the ceramic substrate 2. In the present example, the tip end of the flange portion 4a is protruded over the mounting face 2a to form a guide 5 for guiding the periphery of the object W.

A flange portion 9a of a tubular supporting member 9 is further joined with the back face 4d of the flat-plate shaped member 4. Further, the other end 9b of the tubular supporting member 9 is fixed to a cooling shaft 11 through an O-ring 10. The cooling shaft 11 is designed so that the shaft may be mounted onto a chamber not shown. A guarding tube 8 is further contained inside of the tubular supporting member 9. Rod-shaped electric supplying members 7 are contained inside of the guarding tube 8. One end of the member 7 is connected with a terminal 6, and the other end is connected with a connector 12 in the cooling shaft 11. Electric power may be supplied to the heat resistor 3 through the connector 12, member 7, and terminal 6. The connector 12 is contained in a guarding tube 13.

According to the heating system of the present example, a mounting face 2a for the object W is provided in the ceramic substrate 2. The mounting face 2a generates heat for heating the object W. The thermal deformation of the mounting face 2a over time upon heating of the ceramic substrate is reduced, so that the flatness of the mounting face 2a may be maintained at a low value. Moreover, the ceramic substrate 2 is supported with the metal and plate-shaped supporting member 4 at its back face 2b, so that the production cost of the heating system may be reduced and a mechanical strength required for supporting the system may be assured.

Further, according to the present example, the plate-shaped supporting member 4 has the guide 5 for positioning the object W at the periphery. In this case, it is not necessary to provide a guide in the ceramic substrate 2, so that the structure of the substrate 2 is simple and its production cost may be further reduced.

Figure 2:
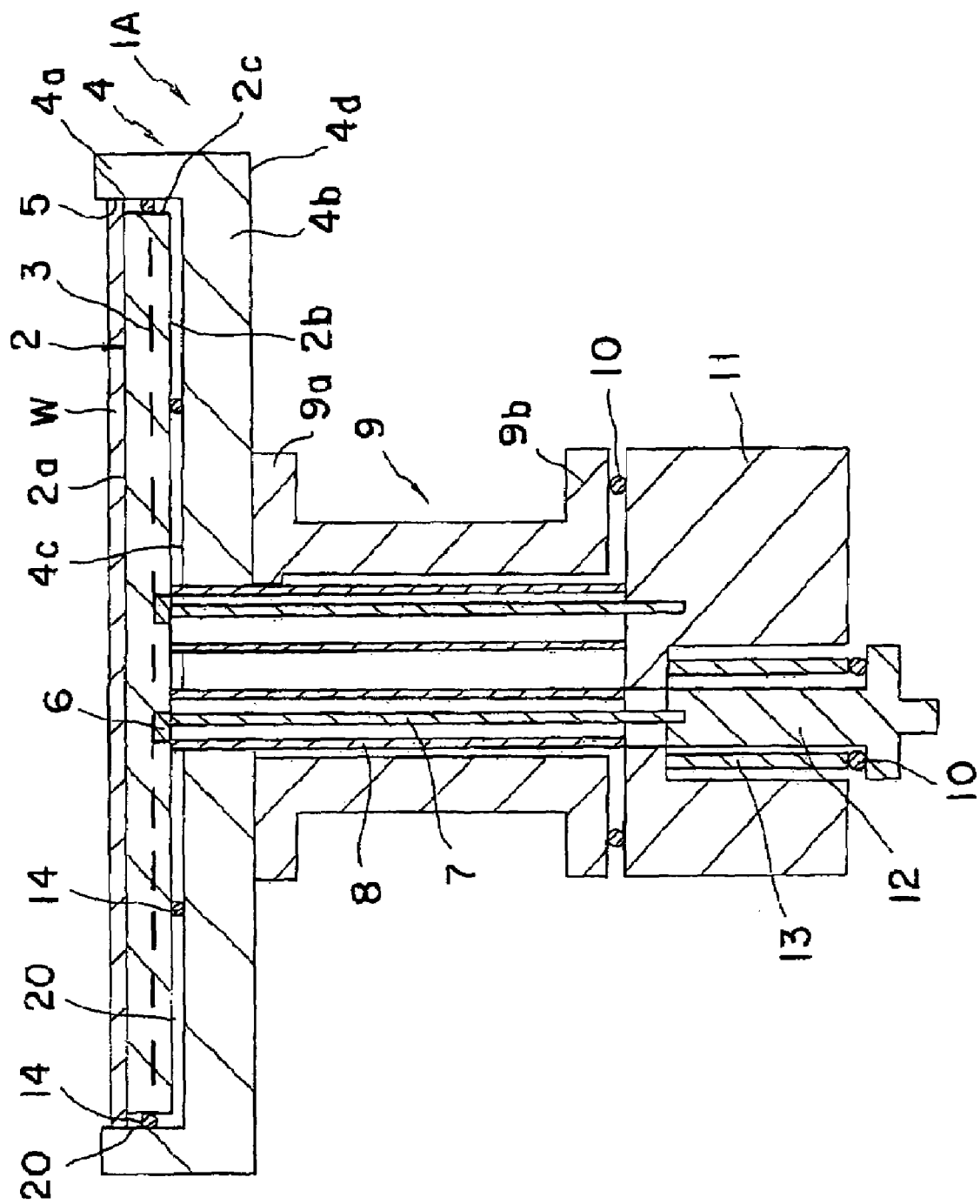
FIG. 2 is a cross sectional view schematically showing a heating system 1A according to another embodiment of the present invention.

In a preferred embodiment, a space is provided between the ceramic substrate and plate-shaped supporting member. In this embodiment, thermal radiation from the ceramic substrate may be reduced. A design for improving the uniformity of temperature on the mounting face may be thus facilitated. More preferably, spaces are provided between the back face of the ceramic substrate and supporting member, and between the side face of the ceramic substrate and supporting member, respectively. FIG. 2 is a cross sectional view schematically showing a heating system 1A according to this embodiment. In FIG. 2, members already shown in FIG. 1 are specified by the same reference numerals and the explanation may be omitted.

In the example of FIG. 2, spacers 14 are provided between the side face 2c of the ceramic substrate 2 and the flange portion 4a of the plate-shaped supporting member 4, and further between the back face 2b of the substrate 2 and the supporting member 4. A space 20 is thus provided. In the space, thermal conduction by radiation is dominant so that thermal conduction is reduced.

According to the example of FIG. 2, the space 20 is formed using the spacer 14. Alternatively, it is possible to provide such space by providing a small protrusion on the back face or side face of the ceramic substrate 2. Further, it is possible to provide such space by providing a small protrusion on the inner wall surface of the plate-shaped supporting member 4. Further, the surface roughnesses of the opposing faces of the ceramic substrate and supporting member may be reduced, so that the thermal conduction through radiation may be further reduced.

The dimension of the space 20 is not particularly limited. The dimension of the space may preferably be not smaller than 0.05 mm and more preferably by not smaller than 0.1 mm, for reducing thermal conduction. The dimension of the space may preferably be not larger than 10 mm and more preferably be not larger than 3 mm, for preventing thermal conduction through convection.

The central surface roughness Ra of each of the opposing ceramic substrate and supporting member may preferably be not larger than 1 micrometer and more preferably be not larger than 0.4 micrometer.

Figure 6:
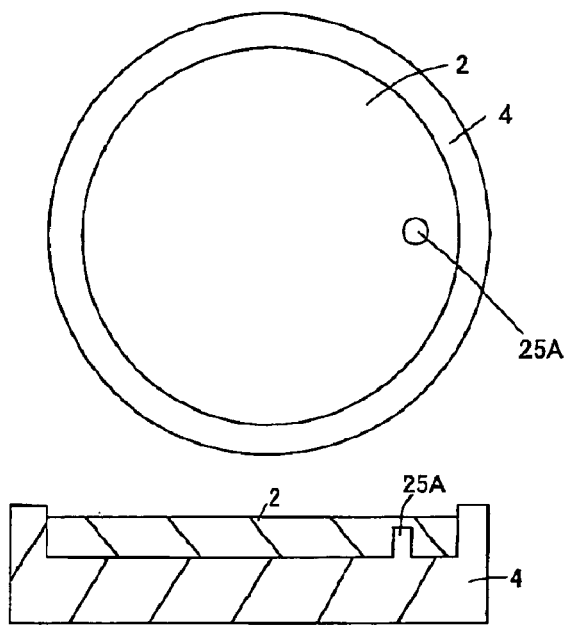
FIG. 6(a) is a schematic view showing a means 25A for preventing the rotation of a ceramic substrate 2 over a supporting substrate 4.
FIG. 6(b) is a schematic view showing a means 25B for preventing the rotation of a ceramic substrate 2 over a supporting substrate 4.
FIG. 6(c) is a schematic view showing a means 25C for preventing the rotation of a ceramic substrate 2 over a supporting substrate 4.
Figure 6:
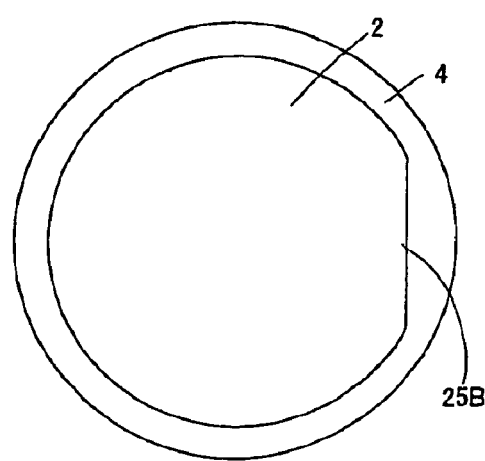
Figure 6:
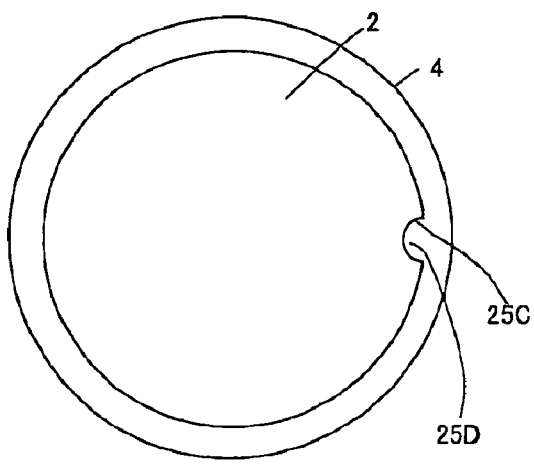

A small space is provided between the side face of the ceramic substrate and the small protrusion of the supporting member, although the substrate and supporting member are joined with each other by means of shrink fit The dimension of the space may preferably be 0 to 200 micrometer and shrink range may preferably be 0 to 100 micrometer. In a preferred embodiment, the dimension of the space is 0 to 100 micrometer and shrink range is 0 to 50 micrometer. When the space is provided, the ceramic substrate may be decentered. A notch or straight is provided on the side face of the ceramic substrate or a pin is inserted for positioning the substrate, as shown in FIG. 6.

The spacer may be made of a material not particularly limited. The material may preferably have a low thermal conduction, and may preferably be a ceramics such as alumina and silicon nitride, stainless steel or an Ni-based alloy such Inconel. The material may preferably be the alloy of aluminum having a high purity, when the heating system is to be used at a temperature under 400° C.

Figure 3:
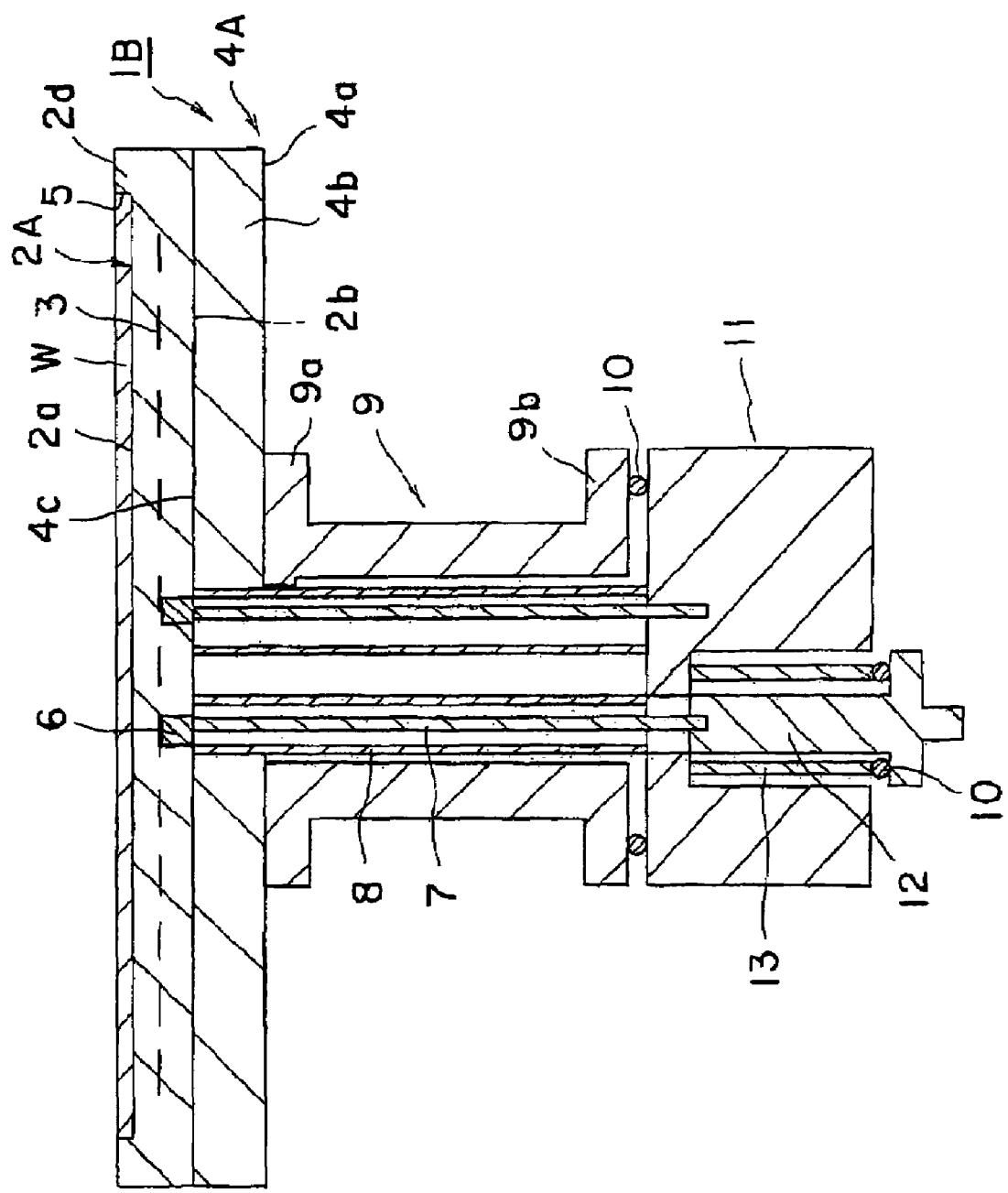
FIG. 3 is a cross sectional view schematically showing a heating system 1B according to still another embodiment of the present invention.

In a heating system 1B shown in FIG. 3, a plate-shaped supporting member 4A is composed of a flat-plate shaped portion 4b, on which a ceramic substrate 2A is mounted. The ceramic substrate 2A has a ring-shaped flange portion 2d, which provides a guide 5 for the object W.

Figure 4:
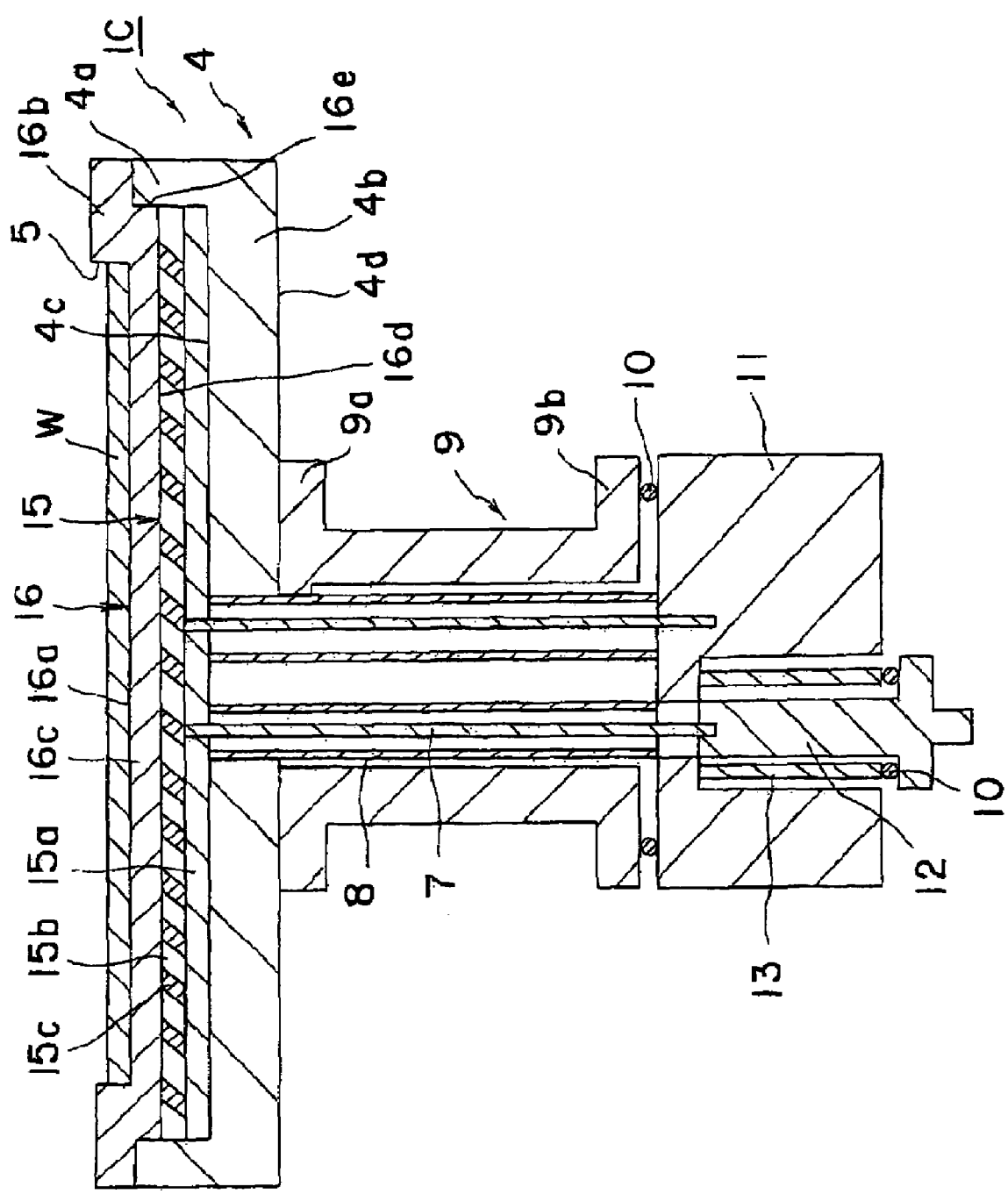
FIG. 4 is a cross sectional view schematically showing a heating system 1C according to still another embodiment of the present invention.
Figure 5:
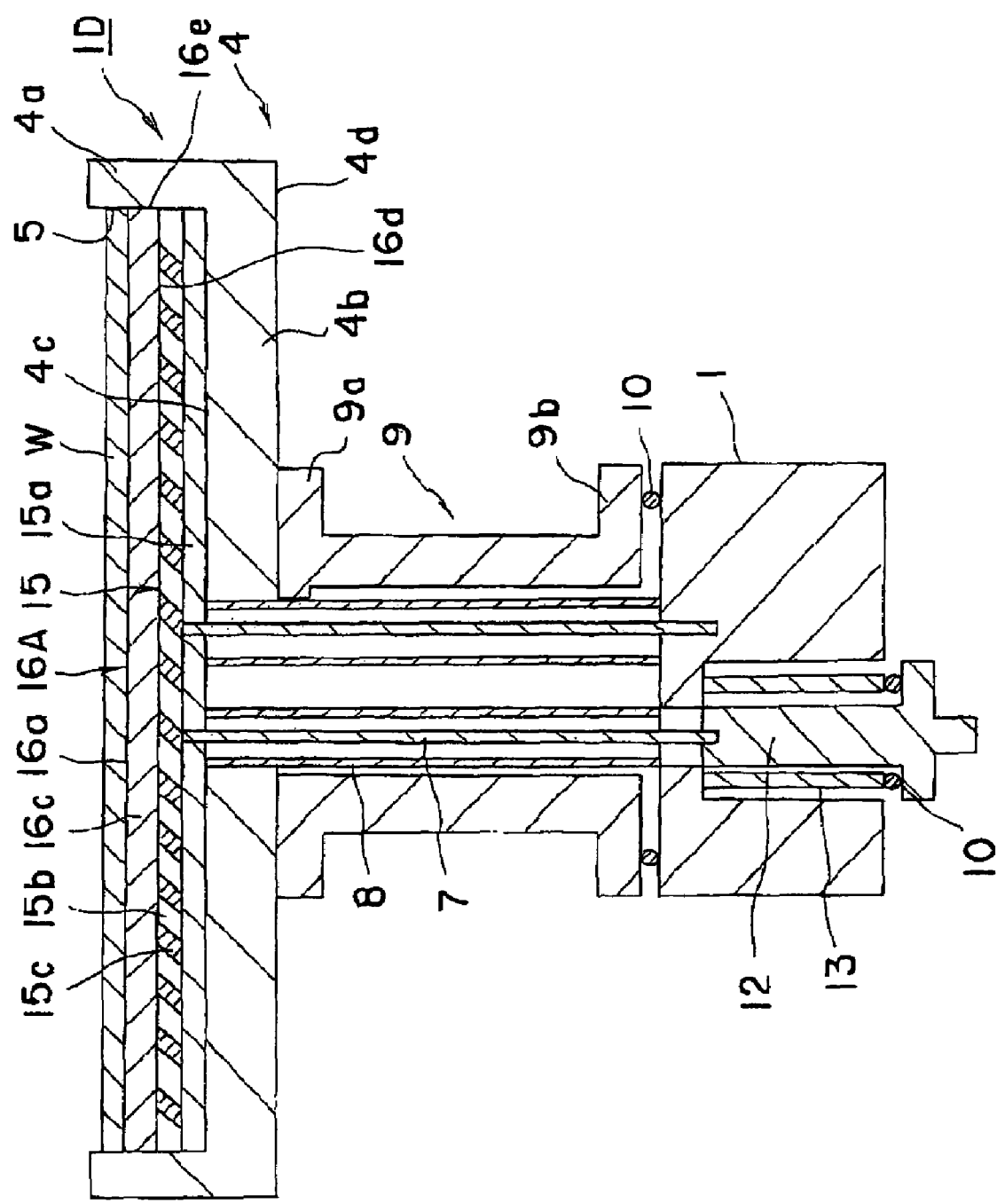
FIG. 5 is a cross sectional view schematically showing a heating system 1D according to still another embodiment of the present invention.

Further in a preferred embodiment, the heating means includes an insulator and a heat resistor fixed on the insulator. FIGS. 4 and 5 show a heating system according to this embodiment.

In a heating system 1C shown in FIG. 4, a heating means 15 is mounted on the flat-plate shaped portion 4b of the plate shaped member 4. The heating means 15 has flat plates 15a, 15b each made of an insulating material, and a heat generator 15c wound on the flat plate 15b. A ceramic substrate 16 is mounted on the heating means 15. The ceramic substrate 16 has a flat-plate shaped portion 16c and flange portion 16b. A guide 5 is formed inside of the flange portion 16b. 16d represents a back face and 16e represents a side face. The object W is mounted on the mounting face 16a of the ceramic substrate 16.

In a healing system ID shown in FIG. 5, a heating means 15 mounted on the flat-plate shaped portion 4b of the plate shaped supporting member 4. The heating means 15 has flat plates 15a, 15b each made of an insulating material, and a heat generator 15c wounded on the flat plate 15b. A ceramic substrate 16A is mounted on the heating means 15. The object W is mounted on the mounting face 16a of the ceramic substrate 16A. A guide 5 is formed inside of the flange portion 4a of the plate shaped supporting member 4.

As shown in FIG. 1, a means 25 having a through hole for preventing rotation may be provided. Alternatively, as shown in FIG. 6(a), a pin 25A may be provided in the supporting substrate 4 as a means for preventing rotation, and the pin is fitted to the back face of The ceramic substrate 2. Alternatively, as shown in FIG. 6(b), a flat surface 25B may be provided as the means for preventing rotation.

Further, as shown in FIG. 6(c), a notch 25C may be fitted to a recess 25D as the means for preventing rotation The material of the ceramic substrate may be selected depending on applications, and not particularly limited. The material may preferably be a ceramics having anti-corrosive property against a halogen based corrosive gas, more preferably be aluminum nitride, dense alumina, silicon carbide or silicon nitride, and most preferably be aluminum nitride ceramics having a relative density of 95 percent or higher or alumina having a relative density of 95 percent or higher. Aluminum nitride having a high thermal conductivity is most preferred. Functional members such as a heat resistor, an electrode for electrostatic chuck and an electrode for generating high frequency may be embedded in the ceramic substrate.

The plate shaped supporting member is made of a material not particularly limited, and may preferably be an alloy of aluminum having a high purity when the heating system is to be used under 400° C. The material may be a heat resistive metal preferably having a low thermal conductivity, when the system is to be used over 400° C. On this viewpoint, SUS and a heat resistive alloy of nickel such as inconel are preferred.

The material for the tubular supporting member is not particularly limited, and may preferably be a heat resistive metal and a metal having a low thermal conductivity. On the viewpoints, SUS and a heat resistive nickel base metal such as inconel are preferred. When the supporting member is exposed to a halogen based corrosive gas, the material may preferably be a corrosion resistive ceramics and more preferably be aluminum nitride or dense alumina. When the heating system is heated at a temperature of 400° C. or lower, the alloy of aluminum having a high purity is preferred.

The plate shaped and tubular supporting members may be joined with each other by any methods, including solid phase welding, solid-liquid phase welding, soldering, and a mechanical joining such as screwing, shrinkage fitting, press fitting, friction welding and welding. The solid liquid phase welding is described in Japanese patent publication 10-273, 370A.

When a heating element is embedded in the ceramic substrate, the material of the element may preferably be a pure metal selected from the group consisting of tantalum, tungsten, molybdenum, platinum, rhenium and hafnium, or an alloy of two or more metals selected from the group consisting of tantalum, tungsten, molybdenum, platinum, rhenium and hafnium. When the substrate is made of aluminum nitride, the material of the heat generator may preferably be molybdenum or the alloy of molybdenum. The shape of the heat generator may be a coil, foil, printed paste (sintered metal), mesh, flat plate, ribbon or sheet. The heat generator having a shape other than a coil is preferred for minimizing the thickness of the ceramic substrate.

The heat generator in the ceramic substrate and terminal 6 may be joined with each other by means of any methods, including soldering and screwing.

When the heat generator is provided in the insulator, the material of the heat generator may be a pure metal selected from the group consisting of tantalum, tungsten, molybdenum, platinum, rhenium and hafnium, or the alloy of two or more metals selected from the group consisting of tantalum, tungsten, molybdenum, platinum, rhenium and hafnium. Further, the material of the heat generator may be Ni—Cr wire, Fe—Cr wire, or SUS wire. The shape of the heat generator may be a coil, foil, flat plate, ribbon or sheet. The heat generator may be inserted into a groove provided in the insulator. Alternatively, the insulator is used as a main body, around which the heat generator may be wound. In the latter case, the metal supporting member may preferably be covered with an insulating material to prevent the direct contact of supporting member and heat generator.

The material of the insulator is not limited, and may preferably be mica on the viewpoint of a low cost and heat resistance. When the heating system is to be used under 300° C., the material may preferably be a polyimide resin on the viewpoint of avoiding contamination of a semiconductor. Further, the material may be a ceramic material such as aluminum nitride, alumina and silicon nitride on the viewpoint of heat resistance and less contamination.

For connecting the heat generator on the insulator and terminal, the heat generator and a electric supply rod (or wire) may be mechanically bonded with deformation by applying a pressure or spot welded.

An application for the heating system according to the present invention is not particularly limited, and includes a system for chemical vapor deposition, etching, baking or curing for a coater.

EXAMPLES

The heating systems shown in FIGS. 1 and 4 were produced. In the example of FIG. 1, the ceramic substrate 2 was made of aluminum nitride sintered body, in which a molybdenum mesh was embedded as the heat generator. The plate shaped supporting member 4 and supporting member 9 were made of inconel. The ceramic substrate 2 was inserted inside of the plate shaped supporting member 4. The ceramic substrate was made distant from the small protrusions on the inner surface of the supporting member at 50 micrometer. The pins 25 each having a through hole were inserted into the ceramic substrate at 4 positions for avoiding the moving of the substrate (see FIG. 1). A through hole was formed in each pin for functioning as a guide plane for a lift pin used for elevating and descending the object.

In the example of FIG. 4, the flat plates 15a and 15b were made of mica plates, respectively. A heat generating wire 15c made of SUS was wound around the mica plate 15b. The mica plate 15a was inserted between the flat-plate shaped supporting member and plate 15b to prevent the direct contact of the heat generators 15c with the supporting member. The plate shaped supporting member 4 and supporting member 9 were made of inconel. The plate shaped supporting member 4 and heating means 15 were joined with each other by screwing.

Further, in the structure shown in FIG. 1, a ceramic heater 2 and metal heater were produced each having a shape of ceramic substrate 2 and plate shaped supporting member 4 integrated with each other. The ceramic heater was made of aluminum nitride sintered body, in which a molybdenum mesh was embedded as a heat generator. The metal heater was made of SUS.

Power was supplied to each heater at a target temperature of 600° C. so that the temperature was elevated from room temperature to 600° C. in an $N_2$ atmosphere (10 Torr). At a target temperature of 600° C., the temperature distribution was observed with an IR camera over an area of a diameter of 300 mm. A difference of the maximum and minimum temperatures observed in the area was calculated (temperature uniformity). Further, the warping of the mounting face was measured after the temperature was elevated from room temperature to 600° C. in an N2 atmosphere (10 Torr) by means of a laser displacement measuring system. The results were shown in table 1.

TABLE 1

| | Warping of Heating face | Temperature uniformity Difference (° C.) of maximum and minimum temperatures in an area Having an diameter φ of 300 mm |
|---|---|---|
| Metal heater only | 30 μm | 15° C. |
| Ceramic heater Only | 5 μm | 6° C. |
| FIG. 1 | 5 μm | 3° C. |
| FIG. 4 | 5 μm | 3° C. |

As can be seen from the results, according to the heating system of the present invention, the warping of the mounting face and the difference between the maximum and minimum temperatures may be reduced. In addition to this, such heating system may be produced at a relatively low cost.

As described above, the present invention provides a heating system for mounting and heating an object, so that the thermal deformation of the mounting face upon heating over time may be reduced and the flatness of the object may be maintained at a low value. It is further possible to impart a mechanical strength to the heater sufficient for its handling and to reduce the production cost.

The present invention has been explained referring to the preferred embodiments. However, the present invention is not limited to the illustrated embodiments which are given by way of examples only, and may be carried out in various modes without departing from the scope of the invention.

The invention claimed is:

1. A heating system comprising:
   a ceramic substrate having a mounting face for mounting a wafer having upper and lower faces, said ceramic substrate also having a back face and a side face;
   a heating means for generating heat from said mounting face of said ceramic substrate, said heating means comprising a heat generator embedded in said ceramic substrate; and
   a plate-shaped metal supporting member for supporting said back face of said ceramic substrate,
   wherein the entire lower face of the wafer opposes said mounting face of said ceramic substrate.

2. The system of claim 1, wherein said metal supporting member comprises a guide for positioning said wafer.

3. The system of claim 1, wherein a space is formed between said ceramic substrate and said metal supporting member.

4. The system of claim 3, wherein one of said ceramic substrate and said metal supporting member comprises a protrusion for defining said space.

5. The system of claim 1, further comprising a tubular supporting member joined with said metal supporting member.

6. A heating system comprising:
   a ceramic substrate having a mounting face for mounting a wafer having upper and lower faces, said ceramic substrate also having a back face and a side face;
   a heating means for generating heat from said mounting face of said ceramic substrate; and
   a plate-shaped metal supporting member for supporting said back face of said ceramic substrate,
   wherein the entire lower face of the wafer opposes said mounting face of said ceramic substrate, and wherein said heating means is provided between said ceramic substrate and said metal supporting member.

7. The system of claim 6, wherein said heating means comprises an insulator and a heat generator fixed onto said insulator.

8. The system of claim 7, wherein said insulator is made of a material selected from the group consisting of mica and polyimide.

9. The system of claim 6, wherein said metal supporting member comprises a guide for positioning said wafer.

10. The system of claim 6, wherein a space is formed between said ceramic substrate and said metal supporting member.

11. The system of claim 10, wherein one of said ceramic substrate and said metal supporting member comprises a protrusion for defining said space.

12. The system of claim 6, further comprising a tubular supporting member joined with said metal supporting member.

* * * * *